United States Patent [19]

Gössler et al.

[11] Patent Number: 4,566,173
[45] Date of Patent: Jan. 28, 1986

[54] GATE INSULATION LAYER AND METHOD OF PRODUCING SUCH A STRUCTURE

[75] Inventors: Werner Gössler, Herrenberg, Fed. Rep. of Germany; Anneliese Strube, Essex Jct., Vt.; Manfred Zurheide, Herrenberg, Fed. Rep. of Germany

[73] Assignee: International Business Machines Corporation, Armonk, N.Y.

[21] Appl. No.: 384,855

[22] Filed: Jun. 4, 1982

[30] Foreign Application Priority Data

Jun. 5, 1981 [DE] Fed. Rep. of Germany ....... 3122382

[51] Int. Cl.$^4$ ............................................ H01L 29/78
[52] U.S. Cl. ................................. 29/571; 29/576 R; 29/589; 357/54; 357/23.5; 427/92; 427/126.4; 427/437; 365/182; 148/DIG. 118
[58] Field of Search ............ 29/571, 578, 589, 576 R; 148/1.5, DIG. 118, DIG. 116; 357/54, 23 VT; 365/182, 185; 427/92, 90, 437, 126.4

[56] References Cited

U.S. PATENT DOCUMENTS

| | | | |
|---|---|---|---|
| 2,722,491 | 11/1955 | Anderson | 427/126.4 |
| 2,890,971 | 6/1959 | Arnold et al. | 427/126.4 X |
| 3,228,795 | 1/1966 | Ackermann | 427/126.4 |
| 3,665,265 | 5/1972 | Fujimoto | 357/23 |
| 3,668,004 | 6/1972 | Yamamoto et al. | 357/23 |
| 3,974,003 | 8/1976 | Zirinsky et al. | 148/187 |
| 3,978,577 | 9/1976 | Bhattacharyya et al. | 29/571 |
| 4,025,669 | 5/1977 | Greenstein | 427/126.4 X |
| 4,115,914 | 9/1978 | Harari | 148/187 X |
| 4,151,537 | 4/1979 | Goldman et al. | 29/571 X |
| 4,151,538 | 4/1979 | Polinsky et al. | 148/187 X |
| 4,244,986 | 1/1981 | Paruso et al. | 427/126.4 |
| 4,416,911 | 11/1983 | Wilkinson-Tough | 427/126.4 X |

OTHER PUBLICATIONS

Jacobs et al.; "N-Channel Si Gate Process for MNOS EEPROM Transistors", Solid State Elec., vol. 24, pp. 517-522, 1981.

*Primary Examiner*—Brian E. Hearn
*Assistant Examiner*—David A. Hey
*Attorney, Agent, or Firm*—Mark F. Chadurjian; George Tacticos

[57] ABSTRACT

The method in accordance with the invention is used for the production of field-effect transistors and preferably implemented in such a manner that a thin aluminum layer (2) is deposited on the surface of a silicon substrate (1), for example, by means of a basic cleaning solution containing aluminum, that subsequently thermal oxidation is effected, during which, in addition to a silicon dioxide layer (3), an about 1 to 1.5 nm thick layer (4) containing aluminum oxide and silicon dioxide is formed and that finally, if required, at least one further layer, for example, an $Si_3N_4$ (5) or an $Si_3N_4$ (5) and an $SiO_2$ layer are deposited. By adding about 400 ppb aluminum to the cleaning solution, which in the finished structure equals a quantity of aluminum of about 250 pg/cm$^2$ layer surface, the threshold voltage $V_S$ is raised by about 470 millivolts.

The structure produced in accordance with the invention is used in particular in N-channel field-effect transistors of the enrichment type which in series connection are integrated in great number and at high density on semiconductor substrates.

11 Claims, 5 Drawing Figures

GATE INSULATION LAYER AND METHOD OF PRODUCING SUCH A STRUCTURE

DESCRIPTION

1. Technical Field

The invention concerns a gate insulation layer and method of producing such a structure on a semiconductor substrate from at least two layers of dielectric material, wherein the layer overlying the bottom-most layer contains aluminum oxide, and the use of such a gate insulation layer structure.

2. Background Art

The gate insulation determines the dielectric parameters of field-effect transistors to a considerable degree. One such important parameter is the so-called threshold voltage $V_S$. In field-effect transistors of the enrichment type, $V_S$ is, for example, the critical gate-source voltage at which an inversion layer in the channel region just starts to form; i.e., it is proceeding from the switched off state of the transistor, at which a drain current starts to flow. A considerable part of the $V_S$ is supplied by the so-called flat band voltage $V_{FB}$. $V_{FB}$ is the voltage causing the energy bands to be flat up to the crystal surface. This will be explained more fully by means of the following example. In an MOS structure, wherein the silicon is N-conductive, positive charges $Q_{ox}$ in the oxide and positively ionized surface states $Q_{SS}$ (since they act like the doping atoms in a semiconductor crystal) produce an inversion layer. The electric field between these positive charges and the negative space charges in the inversion layer (electrons) lead to a bending of the band edges. When a DC voltage is applied to the MOS structure, with the negative pole being connected to the metal and the positive pole to the silicon, the metal layer is negatively charged. The negative charging of the metal drives the electrons in the inversion layer from the silicon surface into the silicon, so that the bending of the band decreases. When the negative charge in the metal layer just about compensates for the positive oxide charge $Q_{ox}$ as well as the positively ionized surface states $Q_{SS}$, the energy bands extend flatly with respect to the crystal surface. The bias applied to the MOS capacitor in such a case is the flat band voltage which is a measure for $Q_{ox}$ and $Q_{SS}$. $V_S$ can be changed by changing $V_{FB}$. In the case of N-channel field-effect transistors of the enrichment type, for example, the value of $V_S$ must be of the order of 1 volt. If $V_S$ is substantially below this value, the transistor no longer switches off reliably. The resultant leakage currents occurring in the switched off state considerably affect the function of monolithic storage circuits. On the other hand, the value of $V_S$ must not be too high either, as high voltage levels during operation determine the heat development and the power dissipation in the chip and also delay the signals. If several such field-effect transistors are connected in series in an integrated circuit, for example a storage circuit, adjustment of the correct $V_S$ becomes even more critical. In such a case there is not only the risk of the field-effect transistors no longer switching off at too low a $V_S$ but also the risk of them no longer switching on at too high a $V_S$. Therefore, it is essential to have means for varying $V_S$ in a defined and reproducible manner over a relatively small voltage range.

For influencing the magnitude of $V_S$ (and also its stability) it is known to vary the thickness of the gate insulation layer and the doping of the semiconductor substrate in the gate region and to influence the positive charges in the oxide by covering the oxide as soon as possible during manufacturing with a further layer of dielectric material, such as $Si_3N_4$ or phosphorus silicate glass.

From the articles by D. R. Young et al in Journal of Electron Materials, Volume 6, Vo. 5, 1977, page 569 ff, and IBM Journal of Research and Development, Volume 22, No. 3, May 1978, page 285 ff, it is known to increase $V_{FB}$ by introducing aluminum by means of ion implantation into the oxide of an MOS (metal oxide silicon) structure. In such a case, the increase in $V_{FB}$ is attributed to electrons becoming caught in traps which are formed as a result of crystal defects caused by ion implantation. However, the ion implantation leads to an intolerable instability in the threshold voltage $V_S$ under the conditions to which the field-effect transistors comprising such a structure are exposed during operation.

German Pat. No. 1,764,513, assigned to Western Electric, describes how $V_S$ is reduced in a field-effect semiconductor control device by using, in place of an $SiO_2$ layer, a layer structure consisting of an $SiO_2$ layer and an overlying 30 to 100 nm thick aluminum oxide layer and wherein by varying the $SiO_2$ layer thickness, $V_S$ can be changed over a wide range. With such a structure it cannot be avoided that when substituting the gate insulation consisting only of $SiO_2$ with the afore-mentioned gate insulation structure, the dielectric characteristics of the structure are noticeably changed, too.

DISCLOSURE OF INVENTION

It is the object of the invention to provide a gate insulation structure and process for manufacturing such gate insulation layer structures, by means of which the threshold voltage can be varied in a defined manner within a fixed voltage range, and wherein the instability of the threshold voltage under stress is below the allowable maximum value.

It is surprising that with the method according to the present invention, non-implanted aluminum, i.e., aluminum that has not been introduced by the generation of crystal defects, also permits the threshold voltage to be varied in a defined manner without, as in the case of the known method using implanted aluminum, a noticeable instability of the threshold voltage occurring under stress. The favorable effects of the method in accordance with the invention are obtained without increasing the doping of the semiconductor material in the gate region or without changing the dielectric characteristics of the insulation structure. An increase in the doping, as, for example, a boron doping in the gate region, leads to the formation of so-called hot electrons making the threshold voltage unstable and causing a gradual shift of the threshold voltage during operation (LITS, Leakage Induced Threshold Shift). This change of the dielectric characteristics of the gate insulation leads to a change in the transconductance $\lambda_n$ of the appertaining field-effect transistor.

In addition, the method is simple, yields reproducible results and does not require more extensive means or more time than the known methods.

It is advantageous to use a silicon body as a substrate and to produce the bottom-most layer from $SiO_2$, an overlying layer, from in addition to aluminum oxide and from $SiO_2$, and any further layer, from $Si_3N_4$. A structure comprised of these materials may be favourably produced by cleaning the silicon surface with a solution containing water, hydrogen peroxide, ammonia and a fixed quantity of an aluminum compound and by subsequently effecting thermal oxidation in a known manner and by then pyrolytically depositing $Si_3N_4$.

The structure produced in accordance with the invention is favourably used in particular for N-channel field-effect transistors of the enrichment type. Compared to P-channel field-effect transistors, N-channel field-effect transistors offer considerable advantages; they have a higher transconductance, a smaller resistance and are easy to produce. For highly integrated, densely packed (Large Scale Integration) semiconductor circuits only field-effect transistors of the enrichment type are suitable which can be integrated in great numbers on a common semiconductor substrate.

Further advantageous embodiments of the invention will be seen from the description and claims.

Ways of carrying out the invention will be described in detail below with reference to drawings in which

BEST MODE FOR CARRYING OUT THE INVENTION

Figure 1A:
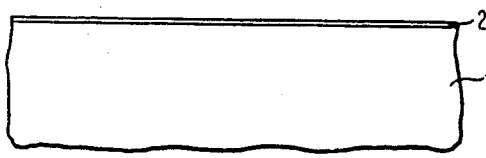
FIGS. 1A to 1C show a gate insulation layer structure at three stages of its production according to a preferred embodiment of the method in accordance with the invention.
Figure 1B:
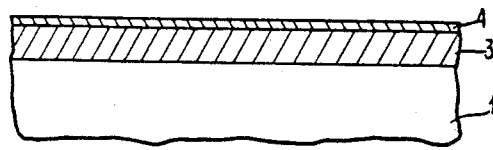
Figure 1C:
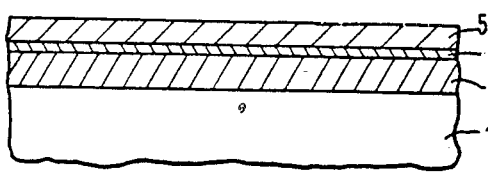

The production of a gate insulation layer structure according to one embodiment of the method in accordance with the invention will be described with reference to FIGS. 1A to 1C in connection with the production of an N-channel field-effect transistor of the enrichment type. It is pointed out, however, that the invention is not limited to the production of gate insulation structures for N-channel field-effect transistors of the enrichment type, or the use of the semiconductor material and the layer materials mentioned below.

The method starts from a silicon substrate of the P-type. The production of the N-doped drain and source regions is effected in a conventional manner. A detailed description of the production of these regions, which is inessential to the invention, has been omitted. The silicon substrate 1, which is bared in at least in the region of the gate to be produced, is cleaned with a basic solution containing water, hydrogen peroxide, ammonia, and an aluminum compound, such as, aluminum chloride. The typical cleaning solution contains water, hydrogen peroxide (30.5 per cent solution) and ammonia (27.5 per cent solution) at a volume ratio of about 5:1:1 and a quantity of the aluminum compound which is such that the proportion of aluminum in the solution ranges from about 20 to 400 ppb (parts by weight per $10^9$ parts by weight of all constituents taken together). Treatment with the solution not only leads to the silicon surface being cleaned but also, since the cleaning solution is basic, to aluminum being deposited on the silicon surface. Tests have shown that at an aluminum content of the cleaning solution of about 400 ppb, after cleaning the quantity of aluminum deposited on the silicon surface was about 250 $pg/cm^2$ (pico grams per square centimeter). If the aluminum content is less than that indicated, the quantity of aluminum deposited on the silicon is reduced in proportion. On the other hand, it is pointed out that a further increase in the aluminum content of the solution does not lead to a further increase in the quantity of aluminum deposited but that the latter obviously tends towards a saturation value. The result of cleaning is diagrammatically represented in FIG. 1A in which the thin aluminum layer is designated with the reference character 2. After cleaning, the silicon substrate 1 with the aluminum layer thereon is oxidized at temperatures ranging from about 900° to about 1100° C. in an atmosphere containing mainly oxygen, where a silicon dioxide layer of a thickness ranging from about 25 to about 40 nm is grown. The aluminum in layer 2 is not built into the silicon dioxide but remains close to the surface of the growing layer 3 of $SiO_2$ and is also oxidized. Oxidation, as shown in FIG. 1B, produces, in addition to the silicon dioxide layer 3, an about 1 to about 1.5 nm thick layer 4 of aluminum oxide and silicon dioxide which is on top of the $SiO_2$ layer 3.

The layer 4 containing aluminum oxide may also be produced in another manner, for example, by pyrolytically depositing a mixture comprised of $Al_2O_3$ and $SiO_2$ on top of an $SiO_2$ layer. However, the above-described method is much simpler, since fewer technical means and less time are required and it is easier to adjust the correct doping of the aluminum.

In the next method step, a silicon nitride layer 5 is deposited on the thin layer 4 containing aluminum oxide. The silicon nitride layer protects the $SiO_2$ arranged underneath during etch processes in which $SiO_2$ is attacked. The silicon nitride layer 5 is preferably pyrolitically produced, for example, by the structure produced up to that stage being exposed at 925° C. to a mixture containing silane, ammonia and hydrogen (as a carrier gas). The silicon nitride layer 5 preferably has a thickness ranging from about 10 to about 15 nm. The structure thus obtained is diagrammatically shown in FIG. 1C. The silicon nitride serves in particular to protect the gate oxide layer 3 against being penetrated by positively charged ions.

The remaining steps up to completion of the field-effect transistors, i.e., production of the contact holes, the contacts and the conductive interconnections, are effected in accordance with known methods and are not directly related to the invention. Therefore, a detailed description of these steps has been omitted.

The presence of layer 4 containing aluminum oxide in the insulation structure leads to the threshold voltage $V_S$ of a field-effect transistor with such a structure being about 80 to about 470 millivolts higher than that of field-effect transistors without a layer 4, depending upon the aluminum content of this layer. In field-effect transistors thus structured the threshold voltage $V_S$ rises as the aluminum content in layer 4 increases. The effect of the aluminum obviously is that its introduction causes negative charges to be built into the silicon dioxide layer 3.

The method in accordance with the invention is also advantageously used for producing field-effect transistors which, unlike the field-effect transistor with an MNOS (metal nitride oxide silicon structure), as described above, comprise an MONOS structure, i.e., field-effect transistors wherein a further silicon dioxide layer is arranged between the metal and the nitride layer. This additional silicon dioxide layer is produced either by a surface layer of the silicon nitride layer 5 being converted into silicon dioxide prior to depositing the conductor material or by depositing on the silicon nitride layer 5 a thin layer of polycrystalline silicon which is then fully converted into silicon dioxide by thermal oxidization. In comparison to the MNOS structure, the MONOS structure has the advantage that electrons originating from the aluminum serving as conductor material are retained at the interface between the additional SiO₂ layer and the silicon nitride layer, whereas in the absence of the additional silicon dioxde layer they would migrate through the nitride. This electron migration leads to a certain degree of instability of the threshold voltage under stress (see below). Therefore, field-effect transistors with an MONOS structure have a more stable threshold voltage during operation than field-effect transistors with an MNOS structure, the remaining electrical characteristics of the two types of transistors being the same.

The following seven examples serve to explain the method in accordance with the invention still further. It is pointed out that the object of the invention can also be accomplished if the method according to the invention is implemented under conditions other than those specified in the examples.

In all examples N-channel field-effect transistors of the enrichment type with an MONOS structure are produced. The examples differ only by the quantity of aluminum built into the thin layer containing aluminum oxide between the first silicon dioxide and the silicon nitride layer. First of all, the P- and N-doped silicon substrate comprising source and drain regions is cleaned with a solution containing water, hydrogen peroxide and ammonia at a volume ratio of 5:1:1 and a fixed quantity of an aluminum compound, in this case aluminum chloride. Then oxidation is effected at 1000° C. in an atmosphere containing 97 per cent by volume oxygen and 3 per cent by volume HCl until an about 31 nm thick silicon dioxide layer has been grown. During this, an about 1 nm thick layer containing aluminum oxide and silicon dioxide is formed on the silicon dioxide layer. In the next method step, an about 20 nm thick silicon nitride layer is pyrolytically deposited on the layer containing aluminum by exposing the structure at 925° C. to a gas mixture containing silane, ammonia and hydrogen as a carrier gas at a volume ratio of 1:150:18000. Then the silicon nitride layer surface is thermally heated at 1075° C. in an oxygen/water vapor atmosphere until an about 7 nm thick silicon dioxide layer has been formed on the silicon nitride layer. After the contact holes have been opened, an about 650 nm thick aluminum layer is vapor deposited, and finally the conductor network is photolithographically generated in a known manner.

The table lists the quantities of aluminum which are contained in the cleaning solutions of the 7 examples, as well as increases in the threshold voltage $V_S$ obtained in each example and the shifts of the threshold voltage $\Delta V_S$ that have to be tolerated under stress as a result of the introduction of aluminum.

TABLE

| Example No. | Quantity of Al in cleaning solution (ppb) | $V_S$ increase (mV) | $\Delta V_S$ (under stress) (mV) |
|---|---|---|---|
| 1 | 0 | 0 | 15 |
| 2 | 30 | 100 | 15 |
| 3 | 80 | 200 | 15 |
| 4 | 200 | 350 | <20 |
| 5 | 300 | 420 | — |
| 6 | 400 | 470 | — |
| 7 | 500 | 500 | 50 |

Figure 2:
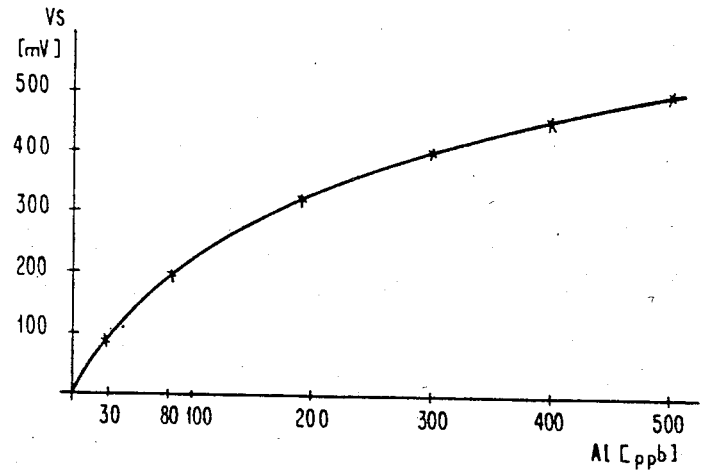
FIG. 2 is a diagram showing the increase in the threshold voltage $V_S$ versus the aluminum content in the cleaning solution used for the preferred embodiment of the method in accordance with the invention.
Figure 3:
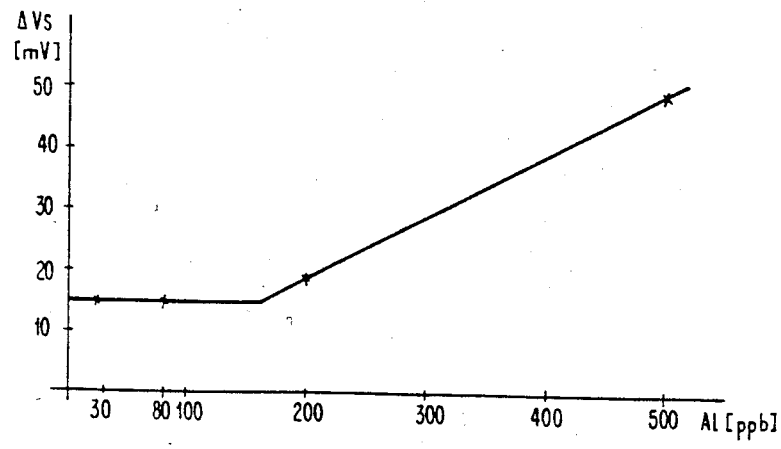
FIG. 3 is a diagram of the change of the threshold voltage $\Delta V_S$ under stress as a function of the aluminum content of the cleaning solution used for the preferred embodiment of the method in accordance with the invention.

$\Delta V_S$ is determined by exposing the structure to a temperature of 100° C. and by simultaneously applying between gate and source a voltage of 17 volts for 10 minutes. $\Delta V_S$ is derived from the difference between the $V_S$ values measured at the beginning and end of the stress situation. FIGS. 2 and 3, in which the $V_S$ and the $\Delta V_S$ values, respectively, of the table are plotted versus the relevant quantities of aluminum in the cleaning solution, show that if no instability of the threshold voltage caused by the aluminum is permissible, up to about 160 (weight) ppb may be added to the cleaning solution, which corresponds to an increase in the threshold voltage $V_S$ of about 300 mV. If an instability of the threshold voltage $V_S$ of up to 40 mV is permissible, which even under exacting conditions is still a very good stability, then, as shown in the diagram of FIG. 3., up to about 400 ppb aluminum may be added to the cleaning solution, so that, as shown in the diagram of FIG. 2, a $V_S$ increase of about 470 mV is obtained. The method in accordance with the invention thus permits varying the threshold voltage $V_S$ of field-effect transistors over a relatively wide range.

The structures produced by means of the method in accordance with the invention are used in particular for N-channel field-effect transistors of the enrichment type which in series connection are integrated in great numbers and high packing density on semiconductor substrates.

Summing up, it may be said that the method in accordance with the invention is used to produce field-effect transistors and is preferably implemented in such a manner that aluminum is deposited on the surface of a P-doped silicon substrate, for example, by means of a basic cleaning solution containing aluminum; that subsequently thermal oxidation is effected, during which, in addition to the oxide, an about 1 to 1.5 nm thick layer containing aluminum oxide and silicon dioxide is formed; and that finally, if required, at least one further layer, for example, an Si₃N₄ or an Si₃N₄ and an SiO₂ layer are deposited. By adding about 400 ppb aluminum to the cleaning solution, which corresponds to a quantity of aluminum of about 250 pg/cm² in the finished structure, the threshold voltage $V_S$ can be increased by about 470 millivolts. However, under stress an instability of the threshold voltage $\Delta V_S$ of 40 millivolts has to be tolerated.

What is claimed is:

1. A method of forming a gate insulation of an FET formed on a semiconductor substrate, comprising:
    treating the substrate with a basic solution having up to approximately 400 ppb of aluminum, so as to deposit up to approximately 250 pg/cm² of aluminum on the substrate; and
    oxidizing the substrate and said aluminum thereon in order to simultaneously form a first dielectric layer comprised of silicon dioxide on the substrate and a second dielectric layer comprised of aluminum oxide and silicon dioxide on said first dielectric layer, said second dielectric layer having a thickness of from about 1.0 to 1.5 nm, whereby said second dielectric layer has an aluminum content sufficient to produce an upward threshold voltage shift of up to approximately 470 millivolts.

2. The invention as defined in claim 1 wherein a third layer of dielectric material is deposited.

3. The invention as defined in claim 2 wherein said third layer is comprised of $Si_3N_4$.

4. The invention as defined in claim 3 wherein said third layer is from about 10 nm to about 15 nm thick.

5. The invention as defined in claim 1, claim 2, claim 3 or claim 4 wherein a fourth layer of dielectric is deposited onto said third layer.

6. The invention as defined in claim 5 wherein said fourth layer is comprised of $SiO_2$.

7. The invention as defined in claim 6 wherein said fourth layer is between about 5 nm and about 10 nm thick.

8. The invention as defined in claim 1 wherein the solution includes water, hydrogen peroxide, and ammonia.

9. The invention of claim 8 wherein the ratio of the water to the hydrogen perioxide, to the ammonia, is about 5:1:1 by volume based on a 30.5% solution of hydrogen peroxide and a 27.5% solution of ammonia.

10. The invention as defined in claim 1 wherein the oxidation is performed at about 1000° C. in a gas atmosphere of about 97% oxygen and about 3% HCl by volume.

11. A method of forming a gate insulation of an FET formed on a semiconductor substrate, comprising:

forming a first dielectric layer comprised of silicon dioxide on a surface of the substrate;

pyrolitically depositing a second dielectric layer on said first dielectric layer, said second dielectric layer comprising a mixture of aluminum oxide and silicon dioxide, said second dielectric layer having a thickness from about 1.0–1.5 nm and an aluminum content of up to approximately 250 pg/cm$^2$ concentrated at an upper portion thereof, said second dielectric layer building up a negative charge in said first dielectric layer such that the resulting FET has a threshold voltage which is shifted upward by up to approximately 470 millivolts; and forming a third dielectric layer on said second dielectric layer.

* * * * *